(12) United States Patent
Strittmatter et al.

(10) Patent No.: US 12,308,835 B2
(45) Date of Patent: May 20, 2025

(54) LEVEL CONVERTER

(71) Applicant: Endress+Hauser SE+Co. KG, Maulburg (DE)

(72) Inventors: Christian Strittmatter, Rickenbach (DE); Simon Gerwig, Schopfheim (DE); Harald Schäuble, Lörrach (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 60 days.

(21) Appl. No.: 18/546,347

(22) PCT Filed: Jan. 27, 2022

(86) PCT No.: PCT/EP2022/051858
§ 371 (c)(1),
(2) Date: Aug. 14, 2023

(87) PCT Pub. No.: WO2022/175050
PCT Pub. Date: Aug. 25, 2022

(65) Prior Publication Data
US 2024/0137021 A1 Apr. 25, 2024
US 2024/0235551 A9 Jul. 11, 2024

(30) Foreign Application Priority Data
Feb. 18, 2021 (DE) .............. 10 2021 103 807.3

(51) Int. Cl.
*H03K 19/018* (2006.01)
*H03K 19/0175* (2006.01)

(52) U.S. Cl.
CPC ............ *H03K 19/01806* (2013.01); *H03K 19/017518* (2013.01)

(58) Field of Classification Search
CPC .............................................. H03K 19/017518
USPC ....................................................... 327/333
See application file for complete search history.

(56) References Cited

U.S. PATENT DOCUMENTS

| | | | | |
|---|---|---|---|---|
| 4,538,076 A | * | 8/1985 | Shimada | H03K 19/09448 326/66 |
| 2004/0174188 A1 | | 9/2004 | Mallory et al. | |
| 2010/0033224 A1 | | 2/2010 | Acharya | |

FOREIGN PATENT DOCUMENTS

| | | |
|---|---|---|
| DE | 10317213 A1 | 11/2004 |
| DE | 102019116193 A1 | 12/2020 |
| JP | 2141022 A | 5/1990 |
| WO | 8901262 A2 | 2/1989 |

* cited by examiner

*Primary Examiner* — Tomi Skibinski
(74) *Attorney, Agent, or Firm* — Mark A. Logan; Endress+Hauser (USA) Holding, Inc.

(57) ABSTRACT

The invention relates to a level converter for adjusting a first reference potential and/or a first communication voltage of a first component to a second reference potential and/or a second communication voltage of a second component, wherein the level converter is arranged between the first component and the second component, wherein the level converter has a first transistor with a downstream first resistor, wherein the level converter is configured in such a way that the second reference potential drops at the first resistor in a blocked state of the first transistor and that the second communication voltage drops at the first resistor in an open state of the first transistor.

5 Claims, 2 Drawing Sheets

LEVEL CONVERTER

CROSS-REFERENCE TO RELATED APPLICATIONS

The present application is related to and claims the priority benefit of DPMA Patent Application No. 10 2021 103 807.3, filed on Feb. 18, 2021, and International Patent Application No. PCT/EP2022/051858, filed Jan. 27, 2022, the entire contents of which are incorporated herein by reference.

TECHNICAL FIELD

The invention relates to a level converter for adjusting a first reference potential and/or a first communication voltage of a first component to a second reference potential and/or a second communication voltage of a second component, wherein the level converter is arranged between the first component and the second component.

BACKGROUND

In automation, field devices serving to record and/or modify process variables are frequently used, particularly in process automation. Sensors, such as fill-level measuring devices, flow meters, pressure and temperature measuring devices, pH and redox potential meters, conductivity meters etc., are used for recording the respective process variables, such as fill level, flow, pressure, temperature, pH value, and conductivity. Actuators, such as, for example, valves or pumps, are used to influence process variables. The flow rate of a fluid in a pipeline section or a fill-level in a container can thus be altered by means of actuators. In principle, all devices which are process-oriented and which supply or process process-relevant information are referred to as field devices. In the context of the invention, field devices also include remote I/Os, radio adapters, and/or, in general, devices that are arranged at the field level.

Field devices are usually connected via a two-wire line, i.e., a line with two separately formed wires, to a higher-level unit, such as a control unit or a control system. The measured values of the sensors or the control values of the actuators are communicated analogously to the higher-level unit as a 4-20 mA current signal. The energy supply of the field devices may likewise take place via the two-wire line, but the available energy is quite limited in this way. If a field device requires more energy than can be provided via the two-wire line, three-wire or four-wire lines are used, for example.

In addition to this analog connection of the field device via the two-wire line, new and digital transmission and communication systems are increasingly playing a role. One of these systems is IO-Link. IO-Link represents a communication system for connecting intelligent sensors and actuators that is standardized standard IEC 61131-9 published with a date of issue of September 2013 and entitled "Single-drop digital communication interface for small sensor and actuator" (SDCI). Several operating states are thus often available in the field device: analog 4-20 mA operation, IO-Link operation and, where applicable, further operating states. One possibility for embedding these different operating states in a uniform electronics is disclosed, for example, in DE 10 2019 116 193 A1.

If individual components of such a circuit are at a common reference potential and use the same communication voltage, direct communication of the components with one another, for example for data exchange, is possible without problems. If this is not the case, level converters are used between the components and adjust the reference potential of the one component to that of the other component. For example, microprocessors frequently have ground (GND, 0 V) as the reference potential and 3.3 V as the communication voltage. On the other hand, an IO device typically has the so-called IOL ground (IOL-GND, −10 . . . 0 V) as the reference potential and IOL-GND+3V as the communication voltage. Previous level converters frequently represent inductive and galvanically isolated transmission components, which are relatively expensive and require a comparatively large amount of space in the circuit. On the other hand, so-called level shifters merely convert the communication voltage from one value to another and can only be used when the reference potentials of the components are identical.

SUMMARY

The object to be achieved of the present invention is therefore to specify a level converter that in a simple manner enables transformation of a communication voltage even in the case of different reference potentials of the components.

The invention is achieved according to the invention by a level converter for adjusting a first reference potential and/or a first communication voltage of a first component to a second reference potential and/or a second communication voltage of a second component, wherein the level converter is arranged between the first component and the second component, wherein the level converter has a first transistor with a downstream first resistor, wherein the level converter is configured in such a way that the second reference potential drops at the first resistor in a blocked state of the first transistor and that the second communication voltage drops at the first resistor in an open state of the first transistor.

The level converter according to the invention is able to transform both a communication voltage and a reference potential from the first component to the second component. This is primarily achieved via the first transistor, the state of which, open or blocked, determines which voltage is obtained at the output of the level converter. A great advantage of the level converter according to the invention is its simple structure. Especially, no inductive or galvanic separations are necessary, but only standardized components, such as a transistor and a resistor, are required.

Since, the second reference potential is obtained in the blocked state of the first transistor and the second communication voltage is obtained in the open state, two levels are thus passed on as the upper and lower limit, or as the high and low level, or as 0 and 1, to the second component so that communication between the two components is made possible. Within the framework of a field device, the level converter according to the invention can be used, for example, between a microprocessor and an IO-Link in order to match the different reference potentials thereof, GND or IOL-GND, and the different communication voltages thereof.

Preferably, the first transistor is a bipolar pnp transistor or a field effect transistor.

In one possible embodiment, the first resistor is arranged between the first transistor and the second reference potential. In this way, in the blocked state of the first transistor, the second reference potential will always drop at the first resistor and thus be provided at the output of the level converter. As the person skilled in the art knows, smaller leakage currents may occur at the first transistor so that the voltage at the output of the level converter may deviate slightly from the second reference potential.

In a further possible embodiment, the first transistor has a first input and a first output, wherein, in the open state of the first transistor, a current flows through the first input and the first output, wherein the first output is connected to the second reference potential, wherein the first input is connected to a first voltage source, wherein the first voltage source outputs a voltage that is identical to the second communication voltage or is a voltage that is higher than the second reference potential, so that in the open state of the first transistor, the second communication voltage drops at the first resistor. When the first transistor is opened, the second communication voltage is to drop at the output of the level converter. If, for example, the second reference potential is GND, i.e., 0 V, the first voltage source outputs the second communication voltage, e.g., 3.3 V, since the second communication voltage is thus obtained at the output of the level converter. In this respect, it should be noted that transistors typically have a saturation voltage, which may result in small deviations of the second communication voltage. In the event that the second reference potential is −10 V, for example, the first voltage source should output a voltage of 3 V so that 3 V is obtained as the second communication voltage.

Advantageously, the open or the blocked state of the first transistor can be set by means of a first control connection of the first transistor. As is known from the prior art, transistors have an input, an output and a control connection. The state of the transistor can be set by means of the latter. As a rule, the transistor is opened as soon as a defined voltage is provided at the control connection; this defined voltage is typically approximately 0.7 V. In the open state of the transistor, a current flows through the input into the output of the transistor. If the defined voltage at the control connection is undershot, the transistor remains blocked. These basic considerations apply both to the first transistor and to the second transistor.

In one possible embodiment, the first input is connected to the first control connection via a fourth resistor, wherein a fifth resistor is connected to the first control side in parallel with the fourth resistor. One possibility of controlling the first transistor by means of the first control connection is to integrate a fourth and a fifth resistor into the level converter. For example, if the first transistor is a pnp transistor, a voltage of about 0.7 V must exit from the first control connection so that the first transistor is opened. By connecting the first control connection to the first input, the pnp transistor is opened only if the difference between the potential at the first input and the potential at the fourth resistor is greater than approximately 0.7 V.

In an alternative embodiment, the first control connection is connected to a second transistor, wherein the second transistor is configured in such a way that the first transistor is open in an open state of the second transistor and that the first transistor is blocked in a blocked state of the second transistor. Instead of using resistors, an additional, second transistor may be used for controlling the first transistor. The second transistor can be part of an open collector output or push/pull output of a component, such as an IO device.

A further embodiment provides that the first reference potential is connected to a second output of the second transistor, wherein a second voltage source is connected to the second input of the second transistor, wherein the second voltage source outputs a voltage that is higher than that of the first reference potential, wherein the first transistor is connected between the second voltage source and the second input of the second transistor, wherein a second resistor and a third resistor is provided between the first transistor and the second voltage source and between the first transistor and the second input of the second transistor, respectively. As a function of the first reference potential, the second voltage source must output such a voltage that, when the second transistor is opened, such a voltage drops at the first control connection of the first transistor that the first transistor is likewise opened.

BRIEF DESCRIPTION OF THE DRAWINGS

The invention is explained in more detail below with reference to FIGS. 1 to 3. In the figures.

DETAILED DESCRIPTION

The level converter according to the invention can especially be used in field devices of all types in which a transformation of the different reference potentials and/or different communication voltages of two components is required.

Figure 1:
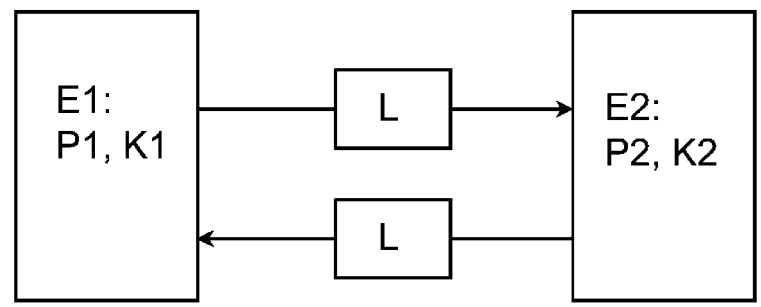
FIG. 1 shows a schematic of the integration of the level converter according to the present disclosure into a circuit.

FIG. 1 shows a schematic of the level converter L according to the invention, which is arranged between a first component E1 and a second component E2. The first and second components E1, E2 each have different first and second reference potentials P1, P2 and first and second communication voltages K1, K2. According to the invention, the level converter L serves to adjust the first reference potential P1 and/or the first communication voltage K1 of the first component E1 to the second reference potential P2 and/or the second communication voltage K2 of the second component E2. Without the level converter L connected between the two components E1, E2, communication between the two components E1, E2 would not be possible. In order to enable communication in both directions, two level converters L are required, which transform in opposite directions. The first component is, for example, a microprocessor which requires a first reference potential of 0 V or GND and a communication voltage of 3 V, while the second component requires an IO device, a second reference potential of −10 . . . 0 V or IOL_GND and a second communication voltage of IOL-GND+3 V for communication.

Figure 2:
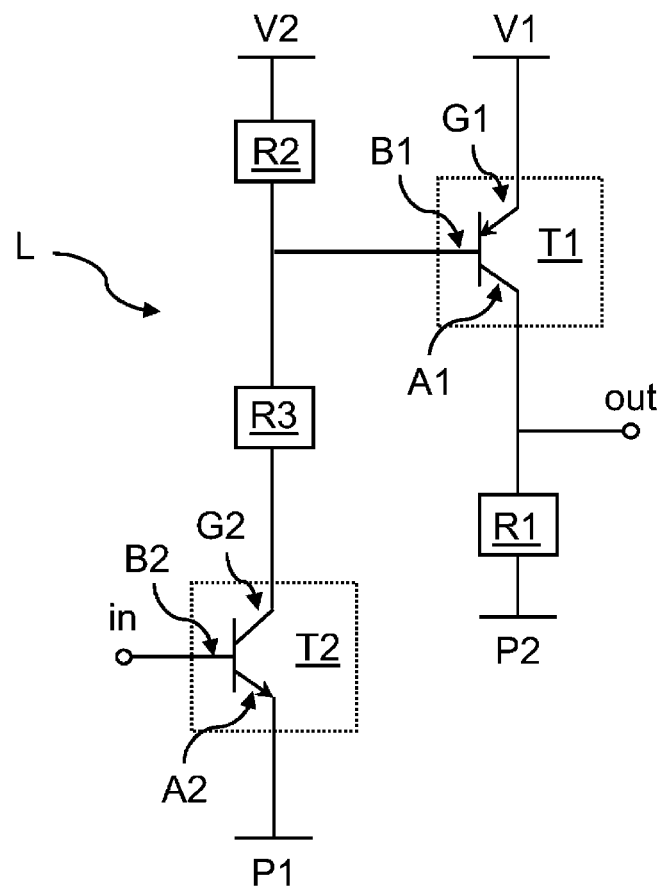
FIG. 2 shows a first embodiment of the level converter according to the present disclosure.

FIG. 2 shows a first possible embodiment of the level converter L according to the invention. The level converter L has an input in and an output out, via which the level converter L is connected to the first and second components E1, E2, and a first transistor T1 with a downstream resistor R1. The first transistor has a first input G1, a first output A1 and a first control connection B1. In the open state of the first transistor T1, a current flows through the first input G1 and the first output A1. The level converter L is configured to obtain, at the first resistor R1, the second reference potential P2 in a blocked state of the first transistor T1 and the second communication voltage K2 in the open state of the first transistor T1. The first transistor T1 is, for example, a bipolar pnp transistor, wherein a field effect transistor may also be used. The first resistor R1 is arranged, for example, between the first output A1 of the first transistor T1 and the second reference potential P2. As a result of this arrangement, in the blocked state of the transistor T1, the second reference potential P2 drops at the first resistor R1.

In order for the second communication voltage K2 to drop at the first resistor R1 in the open state of the first transistor T1, the first input G1 of the first transistor T1 is connected, for example, to a first voltage source V1. The first voltage source V1 is used to output a voltage that is either identical to the second communication voltage K2 or is a voltage that is higher than the second reference potential P2 in such a way that the second communication voltage K2 is obtained at the first resistor R1 in the open state of the first transistor T1. Especially if the second reference potential P2 corresponds to GND, the first voltage source V1 can be set to the second communication voltage K2.

Setting the state of the first transistor T1 or opening and blocking the first transistor T1 takes place, for example, via the first control connection B1. One possibility of controlling the first transistor T1 is to connect a second transistor T2 to the first control connection. The first transistor T1 then assumes the state specified by the second transistor T2, so that both transistors T1, T2 are either simultaneously opened or blocked.

The second transistor T2 in turn has a second input G2, a second output A2 and a second control connection B2. Thus, for example, the first reference potential P1 is connected to the second output A2 and a second voltage source V2 is connected to the second input G2. In order to open the first transistor, the second voltage source V2 must output a voltage that is higher than that of the first reference potential P1. The voltage output at the second voltage source V2 must, for example, be higher than the first reference potential P1 by at least the base current that is necessary to open the first transistor T1 at the first control connection B1. The first transistor T1 is located between the second voltage source V2 and the second input G2. In addition, two further resistors R2, R3 are provided. The second resistor R2 is located between the first transistor T1 and the second voltage source V2. The third resistor R3 is arranged between the first transistor T2 and the second input G2.

The second transistor T2 is controlled by the second control connection B2 at which, for example, at least the first reference potential P1 is received. In this case, the second transistor would be blocked since the first reference potential is likewise applied to the second output A2. The second transistor T2 opens when a voltage that is at least as large as the sum of the first reference potential P1 and the voltage that is at least necessary for switching the second transistor T2 is applied to the second control connection B2.

Figure 3:
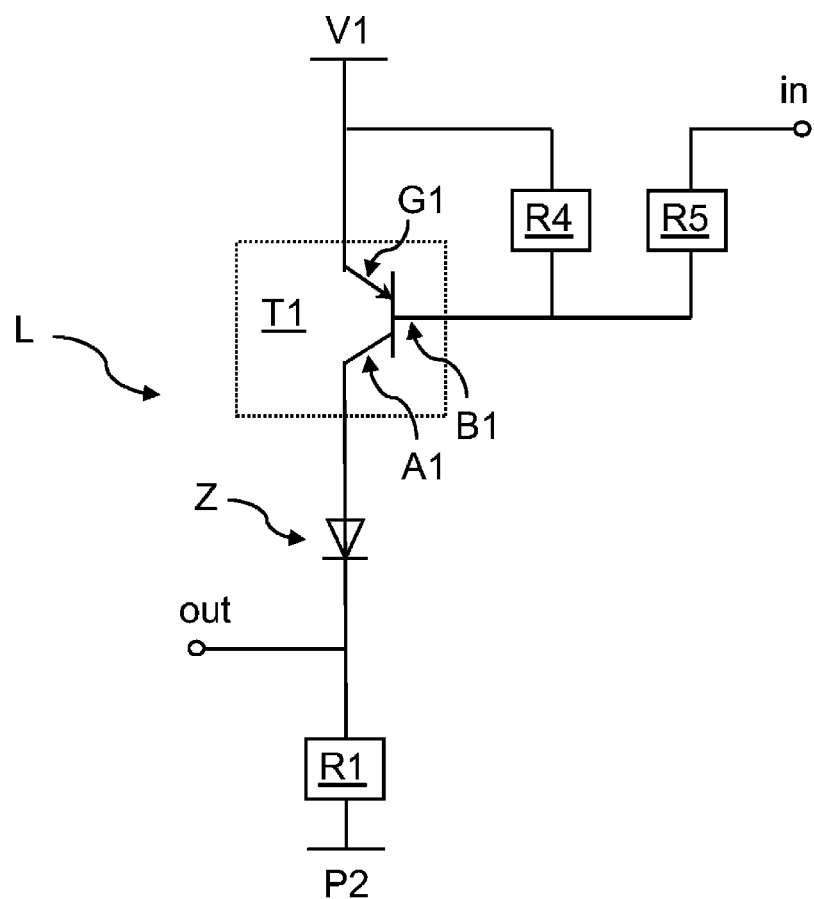
FIG. 3 shows a second embodiment of the level converter according to the present disclosure.

FIG. 3 shows a second embodiment of the level converter according to the invention. In this case, a combination of resistors rather than a second transistor T2 is used for controlling the first transistor T1. The fourth resistor R4 ensures a connection between the first voltage source V1 and the first control connection B1. In parallel with the fourth resistor R4, a fifth resistor R5 is introduced between the input in the level converter and the first control connection. The voltage received by the level converter drops at the fifth resistor R5, while the voltage of the first voltage source V1 drops at the fourth resistor R4. Only if a voltage that corresponds at most to the difference between the voltage of the first voltage source V1 and the base current of the first transistor T1 drops at the node between the fourth resistor R4 and the fifth resistor R5 is the first transistor T1 opened. For example, the first voltage source outputs 3.3 V. If 3.3 V is also applied to the input in of the level converter L, the first transistor T1 is blocked. As soon as a voltage below 2.6 V is applied to the input of the level converter L, the first transistor T1 is opened since the base voltage of the first transistor T1 is approximately 0.7 V.

The invention claimed is:

1. A level converter for adjusting a first reference potential and/or a first communication voltage of a first component to a second reference potential and/or a second communication voltage of a second component, wherein the level converter is arranged between the first component and the second component, the level converter comprising:
   a first transistor having an input, an output, and a control connection, wherein an open state and a blocked state of the first transistor can be set via the control connection of the first transistor;
   a second transistor having an input, an output, and a control connection;
   a first resistor connected downstream of the first transistor; and
   a second resistor and a third resistor connected in series and forming a voltage divider,
   wherein the first reference potential is connected to the output of the second transistor and a second voltage source is connected to the input of the second transistor via the voltage divider of the second and third resistors,
   wherein the control input of the first transistor is connected to the input of the second transistor between the second and third resistors,
   wherein, in the open state of the first transistor, a current flows through the input and the output of the first transistor,
   wherein the output of the first transistor is connected to the second reference potential, and the input of the first transistor is connected to a first voltage source,
   wherein the second transistor is configured such that the first transistor is in the open state in an open state of the second transistor and the first transistor is in the blocked state in a blocked state of the second transistor
   wherein the level converter is configured such that the second reference potential drops at the first resistor in a blocked state of the first transistor and that the second communication voltage drops at the first resistor in an open state of the first transistor.

2. The level converter according to claim 1, wherein the first transistor is a bipolar PNP transistor or a field effect transistor.

3. The level converter according to claim 1, wherein the first resistor is arranged between the first transistor and the second reference potential.

4. The level converter according to claim 1, wherein the first voltage source outputs a voltage that is identical to the second communication voltage or is a voltage that is higher than the second reference potential, so that in an open state of the first transistor, the second communication voltage drops at the first resistor.

5. The level converter according to claim 1, wherein the second voltage source outputs a voltage that is higher than that of the first reference potential.

* * * * *